US008681502B2

(12) United States Patent
Wu et al.

(10) Patent No.: US 8,681,502 B2
(45) Date of Patent: Mar. 25, 2014

(54) SHELL STRUCTURE AND ELECTRONIC DEVICE HAVING THE SAME

(75) Inventors: Jung-Chin Wu, Taipei (TW); Po-An Lin, Taipei (TW); Kuo-Nan Ling, Taipei (TW); Han-Ching Huang, Taipei (TW); Wan-Li Chuang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 144 days.

(21) Appl. No.: 13/332,377

(22) Filed: Dec. 21, 2011

(65) Prior Publication Data

US 2012/0162921 A1    Jun. 28, 2012

Related U.S. Application Data

(60) Provisional application No. 61/427,098, filed on Dec. 23, 2010.

(51) Int. Cl.
*H05K 7/20*      (2006.01)

(52) U.S. Cl.
USPC ........... 361/714; 361/704; 361/707; 165/80.3

(58) Field of Classification Search
None
See application file for complete search history.

(56) References Cited

U.S. PATENT DOCUMENTS

| | | | | |
|---|---|---|---|---|
| 8,207,598 B2 * | 6/2012 | Ararao et al. | | 257/666 |
| 8,223,497 B2 * | 7/2012 | Sundstrom et al. | | 361/707 |
| 8,314,346 B2 * | 11/2012 | Hasegawa et al. | | 174/260 |
| 8,368,112 B2 * | 2/2013 | Chan et al. | | 257/99 |
| 8,385,078 B2 * | 2/2013 | Ibori et al. | | 361/742 |
| 8,450,842 B2 * | 5/2013 | Ueda | | 257/698 |
| 8,520,394 B2 * | 8/2013 | Wakita | | 361/720 |
| 2003/0161108 A1 * | 8/2003 | Bright et al. | | 361/707 |
| 2004/0136162 A1 * | 7/2004 | Asai et al. | | 361/715 |
| 2005/0271859 A1 | 12/2005 | Tuss et al. | | |
| 2008/0310167 A1 * | 12/2008 | Zaderej et al. | | 362/294 |
| 2012/0135867 A1 * | 5/2012 | Thom et al. | | 505/210 |

FOREIGN PATENT DOCUMENTS

| TW | M387772 | 9/2010 |
|---|---|---|
| TW | M392746 | 11/2010 |

OTHER PUBLICATIONS

"Office Action of Taiwan Counterpart Application", issued on Oct. 29, 2013, p. 1-p. 12.

* cited by examiner

*Primary Examiner* — Boris Chervinsky
(74) *Attorney, Agent, or Firm* — Jianq Chyun IP Office

(57) ABSTRACT

A shell structure suitable for an electronic device is provided. The electronic device has a heat generating element. The shell structure includes a core layer, a first material layer, and a second material layer. The core layer includes a thermal insulating area and a thermal conducting area. The core layer has first and second surfaces opposite to each other. The first material layer is configured on the first surface. The second material layer is configured on the second surface. The thermal insulating area is aligned to the heat generating element, and the shell structure covers the heat generating element, such that heat generated by the heat generating element is transferred to the first material layer through the second material layer and the heat conducting area to perform heat dissipation, and a position of the first material layer aligned to the heat generating element is prevented from generating a heat point.

16 Claims, 2 Drawing Sheets

SHELL STRUCTURE AND ELECTRONIC DEVICE HAVING THE SAME

CROSS-REFERENCE TO RELATED APPLICATION

This application claims the priority benefits of U.S. provisional application Ser. No. 61/427,098, filed on Dec. 23, 2010. The entirety of the above-mentioned patent application is hereby incorporated by reference herein and made a part of this specification.

BACKGROUND OF THE INVENTION

1. Field of the Invention

The present invention generally relates to a shell structure and an electronic device having the same, in particular, to a shell structure including a core layer having a thermal insulating area and a thermal conducting area, and an electronic device having the same.

2. Description of Related Art

In recent years, functions of a portable electronic device become increasingly diversified, a volume becomes increasingly smaller. Further, with convenience of wireless communication and wireless network, people may obtain network information through the portable electronic device, so that the portable electronic device becomes increasingly popular. The portable electronic device is a working platform capable of being carried by people to anywhere, and stores a great amount of data and application programs. If a structure strength does not satisfy security protection standards, is not pressure proofing, and is not collision proofing, troublesome in carrying is resulted. In order to enhance the portability, the thickness and the weight of the portable electronic device are continuously reduced, but the lowering of the thickness and the weight collides with the maintaining of the structure strength in certain design features. Therefore, enhancing the structure strength of the portable electronic device and lowering the thickness and the weight of the entire structure are always key points in designing the portable electronic device.

A composite material formed by combining a light material, for example, mylar, graphite, bamboo fiber, or carbon fiber with a composite material has a good structure strength, and is light and thin, so as to be applied to a shell of an electronic device. When the composite material includes a high thermal conducting material, for example, the graphite, a position of a surface of the shell of the electronic device corresponding to a heat generating element may have higher temperature, so that a user may feel uncomfortable.

SUMMARY OF THE INVENTION

Accordingly, the present invention is directed to a shell structure, in which temperature of a position of a surface corresponding to a heat generating element may be lowered.

The present invention is further directed to an electronic device, in which temperature of a position of a surface of a shell structure corresponding to a heat generating element may be lowered.

The present invention provides a shell structure, suitable for an electronic device. The electronic device has a heat generating element. The shell structure includes a core layer, a first material layer, and a second material layer. The core layer has a thermal conducting area, a thermal insulating area, a first surface, and a second surface opposite to the first surface, in which the thermal conducting area is adjacent to the thermal insulating area. The first material layer is configured on the first surface and contacts the thermal conducting area and the thermal insulating area. The second material layer is configured on the second surface and contacts the thermal conducting area and the thermal insulating area. The heat generating element is aligned to the thermal insulating area and heat generated by the heat generating element is transferred to the first material layer through the second material layer and the thermal conducting area.

The present invention provides an electronic device, which includes a shell structure and a heat generating element. The shell structure includes a core layer, a first material layer, and a second material layer. The core layer has a thermal conducting area, a thermal insulating area, a first surface, and a second surface opposite to the first surface, in which the thermal conducting area is adjacent to the thermal insulating area. The first material layer is configured on the first surface and contacts the thermal conducting area and the thermal insulating area. The second material layer is configured on the second surface and contacts the thermal conducting area and the thermal insulating area. The heat generating element is disposed on a circuit board and aligned to the thermal insulating area, in which heat generated by the heat generating element is transferred to the first material layer through the second material layer and the thermal conducting area.

In an embodiment of the present invention, a material of the thermal insulating area includes styrofoam, cotton, wood, or plant fiber.

In an embodiment of the present invention, a thermal conducting speed of the thermal conducting area in a first direction is greater than a thermal conducting speed of the thermal conducting area in a second direction, in which the second direction is a normal vector of a plane of the core layer and the first direction is vertical to the second direction.

In an embodiment of the present invention, a material of the thermal conducting area includes graphite.

In an embodiment of the present invention, the shell structure further includes a first bonding layer and a second bonding layer. The first bonding layer is located between the core layer and the first material layer, and used to bond the core layer and the first material layer. The second bonding layer is located between the core layer and the second material layer, and used to bond the core layer and the second material layer.

In an embodiment of the present invention, the first bonding layer located between the thermal conducting area and the first material layer and the second bonding layer located between the thermal conducting area and the second material layer are bonding layers with high thermal conducting coefficients.

In an embodiment of the present invention, the heat generating element contacts the second material layer.

In an embodiment of the present invention, the core layer is a woven layer and the first material layer and the second material layer are metal plates.

Based on the above mentioned, in a shell structure according to the present invention, a thermal insulating area is configured in a core layer, and the thermal insulating area is aligned to a heat generating element in an electronic device. Through insulation of the thermal insulating area, heat generating by the heat generating element is not directly conducted to a position of a surface of the shell structure corresponding to the heat generating element, but is relatively uniformly dispersed to other parts of the shell structure through a first material layer, a thermal conducting area of the core layer, and a second material layer, so as to prevent a user from being uncomfortable due to high temperature when contacting the position of the surface of the shell structure corresponding to the heat generating element, thereby enhancing comfort degree of the electronic device in using.

In order to make the aforementioned features and advantages of the disclosure comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
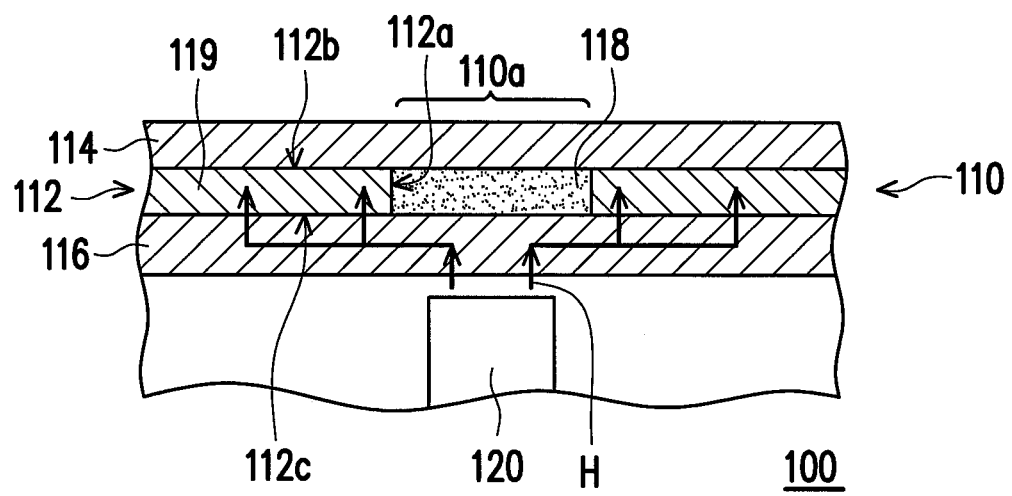
FIG. 1 is a partial cross-sectional view of an electronic device according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a partial cross-sectional view of an electronic device according to an embodiment of the present invention. Referring to FIG. 1, the electronic device 100 of this embodiment includes a shell structure 110 and a heat generating element 120. The shell structure 110 includes a core layer 112, a first material layer 114, and a second material layer 116, in which core layer 112 is differentiated into a thermal insulating area 118 and a thermal conducting area 119. The thermal conducting area 119 of the core layer 112 has an opening 112a, a first surface 112b, and a second surface 112c opposite to the first surface 112b. The first material layer 114 is configured on the first surface 112b, and the second material layer 116 is configured on the second surface 112c. The thermal insulating area 118 is configured on the opening 112a and is used to adjacent to the thermal conducting area 119. The core layer 112 is located between the first material layer 114 and the second material layer 116 and may be a woven layer, in which a material of the first material layer 114 and the second material layer 116 may be a material with a high thermal conducting coefficient and the first material layer 114 and the second material layer 116 may be metal plates. The material of the first material layer 114 and the second material layer 116 may be the material with the high thermal conducting coefficient, for example, aluminum, copper, or ferrum, but in the embodiment of the present invention, in order to consider strength and weight of the shell of the electronic device, usually aluminum is adopted as the material of the first material layer 114 and the second material layer 116, but the scope of the present invention is not limited. The shell structure 110 covers the heat generating element 120, and the heat generating element 120 is aligned to the thermal insulating area 118. As manufacturing processes are different, if the core layer 112 is a woven layer, the thermal insulating area 118 and the thermal conducting area 119 of the core layer may be braided together, but the scope of the present invention is not limited.

Under the configuration manner, in the shell structure 110, the thermal insulating area 118 is configured in the opening 112a of the core layer 112, and the thermal insulating area 118 is aligned to the heat generating element 120 in the electronic device 100, in which the heat generating element 120 is installed on a circuit board. Through insulation of the thermal insulating area 118, heat H generated by the heat generating element 120 is not directly conduct to a position 110a of a surface of the shell structure 110 corresponding to the heat generating element 120 to generate a heat point. The heat H of the heat generating element 120 is directly transferred to the thermal conducting area 119 of the core layer 112 through the second material layer 116, and is relatively uniformly dispersed to other parts of the shell structure 112 through conduction of the thermal conducting area 119, so as to prevent a user from being uncomfortable due to high temperature when contacting the position 110a of the surface of the shell structure 110 corresponding to the heat generating element 120, thereby enhancing comfort degree of the electronic device 100 in using. In the present invention, the thermal conducting area 119 of the core layer 112 may be a braided layer with a high thermal conducting coefficient and the thermal conducting area 119 of the core layer may be a braided layer having a material of graphite.

The thermal insulating area 118 is usually a thermal insulating element with a low thermal conducting coefficient, and in order to enhance the strength of the shell structure and lower the weight of the shell structure, the thermal insulating area usually may also be a braided fabric with a low thermal conducting coefficient. In this embodiment, a material of the thermal insulating area 118 may be a material with a relatively low thermal conducting coefficient, for example, styrofoam, cotton, or plant fiber. In other embodiments, the thermal insulating area 118, the core layer 112, the first material layer 114, and the second material layer 116 may select other suitable materials, which is not limited in the present invention.

In the embodiment of the present invention, although the materials of the first material layer 114, the thermal conducting area 119 of the core layer 112, and the second material layer 116 are materials with the high thermal conducting coefficients, but functions are slightly different. Through the feature of the high thermal conducting coefficient, the second material layer 116 absorbs the heat generated by the heat generating element 120 and quickly transfers the heat to the thermal conducting area 119 of the core layer 112. Although the thermal conducting area 119 of the core layer 112 is also the material with the high thermal conducting coefficient, when the thermal conducting area 119 of the core layer 112 performs thermal transferring, a thermal transferring speed in a first direction is much greater than a thermal transferring speed in a second direction, in which the second direction is a normal vector of a plane of the core layer 112, and the first direction is vertical to the second direction. The thermal transferring speed of the core layer 112 in the direction of the plane is relatively fast, so when the heat H transferred from the second material layer 116 is received, the heat H may be quickly dispersed to other parts of the thermal conducting area 119 of the core layer 112, and the dispersed heat H is transferred out of the shell structure 110 of the electronic device through the first material layer 114, so that the shell structure 110 of the electronic device has a heat dissipation performance and the position of the surface of the first material layer 114 aligned to the heat generating element 120 does not generate the heat point.

Figure 2:
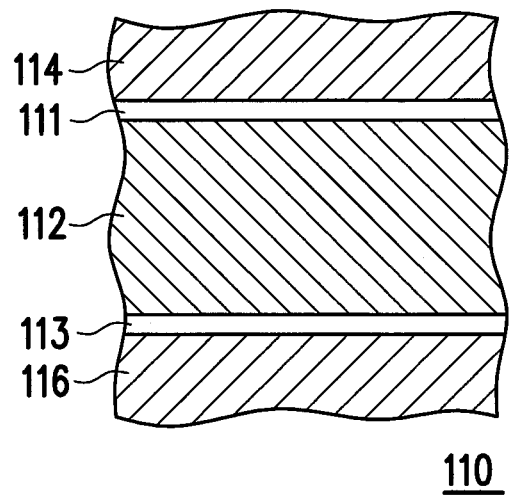
FIG. 2 is a partial enlarged view of a shell structure of FIG. 1.

FIG. 2 is a partial enlarged view of a shell structure of FIG. 1. Referring to FIG. 2, in this embodiment, the shell structure 110 further includes a first bonding layer 111 and a second bonding layer 113. The first bonding layer 111 is located between the core layer 112 and the first material layer 114, and is used to bond the first material layer 114 and the core layer 112. The second bonding layer 113 is located between the core layer 112 and the second material layer 116, and is used to bond the second material layer 114 and the core layer 112. The core layer 112, the first material layer 114, and the second material layer 116 are stably combined through the first bonding layer 111 and the second bonding layer 113 and form a composite material layer. By using the composite material layer as the shell, the strength of the shell of the electronic device may be improved. In the present invention, the braided layer with the high thermal conducting coefficient may be used as the core layer, so as to enhance the strength of the shell and improve a heat dissipation efficiency of the electronic device. As product designs are different, the first bonding layer 111 located between the first material layer 114 and the thermal conducting area 119 of the core layer 112 may be a bonding layer with a high thermal conducting coefficient, so as to quickly transfer the dispersed heat from the thermal conducting area 119 of the core layer 112 to the first material layer 114 for performing heat dissipation. The thermal conducting area 119 located between the second material layer 116 and the thermal conducting area 119 of the core layer 112 may be a bonding layer with a high thermal conducting coefficient, so as to quickly transfer the heat generated by the heat generating element 120 to the thermal conducting area 119 of the core layer 112 to perform heat dispersion. In the embodiment of the present invention, the used bonding layer with the high thermal conducting coefficient is a thermal conducting adhesive and a thermal conductivity of the bonding layer with the high thermal conducting coefficient is approximately greater than 0.2 W/mk, but the scope of the present invention is not limited. The first bonding layer 111 located between the first material layer 114 and the thermal insulating area 119 of the core layer 112 may be a bonding layer with high thermal resistance, so that a boding force between the thermal insulating area 119 and the first material layer is not lowered due to the high temperature. The second bonding layer 113 located between the second material layer 116 and the thermal insulating area 119 of the core layer 112 may be a bonding layer with high thermal resistance, so that a boding force between the thermal insulating area 119 and the second material layer 116 is not lowered due to the high temperature. As manufacturing demands are different, the first bonding layer 111 between the thermal insulating area 119 of the core layer 112 and the second bonding layer 113 between the thermal insulating area and the second material layer may also be the bonding layers with the high thermal conducting coefficients, but the scope of the present invention is not limited.

During a process of fabricating the shell structure 110, for example, before the core layer 112, the first bonding layer 114, and the second bonding layer 116 are combined, the opening 112a is formed on the position of the core layer 112 aligned to the heat generating element 120. Next, one side of the core layer 112 is bonded to one of the first material layer 114 and the second material layer 116, and the thermal insulating element 118 is configured in the opening 112a. Finally, the other side of the core layer 112 is bonded to the other one of the first material layer 114 and the second material layer 116, so that the thermal insulating element 118 is located between the first material layer 114 and the second material layer 116, so as to finish fabricating the shell structure 110.

As product designs are different, when the thermal insulating element 118 and the core layer 112 are the same layer and the thermal insulating element 118, and the thermal insulating element 119 becomes the thermal insulating area on the core layer 112, the core layer 112 is differentiated into the thermal insulating area and the thermal conducting area, in which the thermal insulating area is aligned to the heat generating element 120 in the element device 100, and is used to uniformly disperse the heat generated by the heat generating element 120 to other parts of the shell structure 110 through the thermal conducting area, so as to prevent the surface of the shell structure from generating the heat point.

Figure 3:
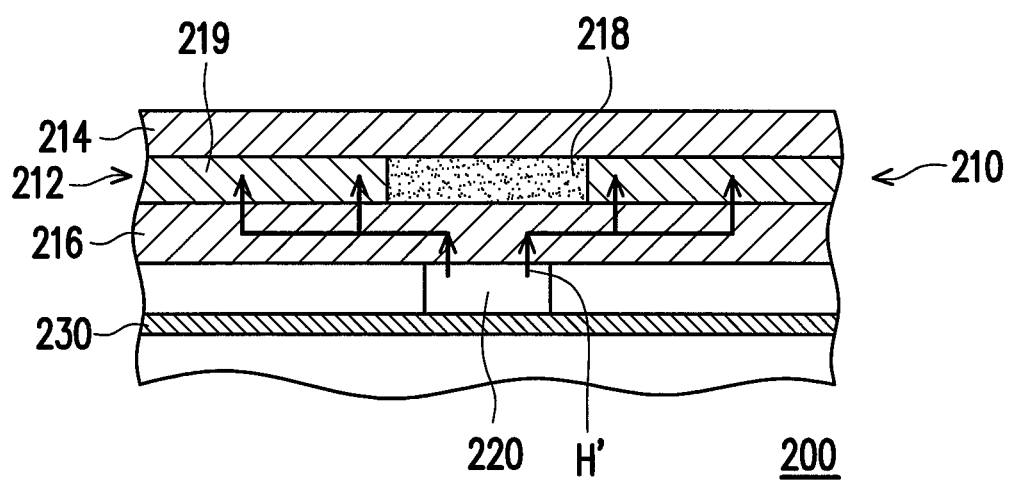
FIG. 3 is a partial cross-sectional view of an electronic device according to another embodiment of the present invention.

FIG. 3 is a partial cross-sectional view of an electronic device according to another embodiment of the present invention. Referring to FIG. 3, in a shell structure 210 of this embodiment, configuration manners of a core layer 212, a first material layer 214, and a second material layer 216 are the same as that of the core layer 112, the first material layer 114, the second material layer 116, and the thermal insulating element 118 of the shell structure 110 as shown in FIG. 1, and the description is omitted here. A heat generating element 220 of an electronic device 200 is aligned to a thermal insulating area 218, and further contracts the second material layer 216, so that heat generated by the heat generating element 200 may be more quickly transferred to a thermal conducting area 219 of the core layer 212 through the second material layer 216, so as to disperse the heat to other parts of the shell structure 210.

In the embodiment of FIG. 3, the heat generating element 220 is, for example, a central processing unit (CPU) configured on the circuit board 230, or other electronic device, and the present invention does not limit the types of the heat generating element.

To sum up, in a shell structure according to the present invention, a thermal insulating area is configured in a core layer, and the thermal insulating area is aligned to a heat generating element in an electronic device. Through insulation of the thermal insulating area, heat generating by the heat generating element is not directly conducted to a position of a surface of the shell structure corresponding to the heat generating element, but is relatively uniformly dispersed to other parts of the shell structure through a first material layer, a thermal conducting area of the core layer, and a second material layer, so as to prevent a user from being uncomfortable due to high temperature when contacting the position of the surface of the shell structure corresponding to the heat generating element, thereby enhancing comfort degree of the electronic device in using.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shell structure, suitable for an electronic device, wherein the electronic device comprises a heat generating element, the shell structure comprising:
   a core layer, comprising a thermal conducting area, a thermal insulating area, a first surface, and a second surface opposite to the first surface, wherein the thermal conducting area is adjacent to the thermal insulating area;
   a first material layer, configured on the first surface and contacting the thermal conducting area and the thermal insulating area; and
   a second material layer, configured on the second surface and contacting the thermal conducting area and the thermal insulating area;
   wherein the heat generating element is aligned to the thermal insulating area and heat generated by the heat generating element is transferred to the first material layer through the second material layer and the thermal conducting area.

2. The shell structure according to claim 1, wherein a material of the thermal insulating area comprises styrofoam, cotton, wood, or plant fiber.

3. The shell structure according to claim 1, wherein a thermal conducting speed of the thermal conducting area in a first direction is greater than a thermal conducting speed of the thermal conducting area in a second direction, the second direction is a normal vector of a plane of the core layer and the first direction is vertical to the second direction.

4. The shell structure according to claim 1, wherein a material of the thermal conducting area comprises graphite.

5. The shell structure according to claim 1, further comprising:
   a first bonding layer, located between the core layer and the first material layer, and used to bond the core layer and the first material layer; and
   a second bonding layer, located between the core layer and the second material layer, and used to bond the core layer and the second material layer.

6. The shell structure according to claim 5, wherein the first bonding layer located between the thermal conducting area and the first material layer and the second bonding layer located between the thermal conducting area and the second material layer are bonding layers with high thermal conducting coefficients.

7. The shell structure according to claim 1, wherein the heat generating element contacts the second material layer.

8. The shell structure according to claim 1, wherein the core layer is a woven layer and the first material layer and the second material layer are metal plates.

9. An electronic device, comprising:
   a shell structure, comprising:
      a core layer, comprising a thermal conducting area, a thermal insulating area, a first surface, and a second surface opposite to the first surface, wherein the thermal conducting area is adjacent to the thermal insulating area;
      a first material layer, configured on the first surface and contacting the thermal conducting area and the thermal insulating area; and
      a second material layer, configured on the second surface and contacting the thermal conducting area and the thermal insulating area; and
   a heat generating element, disposed on a circuit board and aligned to the thermal insulating area, wherein heat generated by the heat generating element is transferred to the first material layer through the second material layer and the thermal conducting area.

10. The electronic device according to claim 9, wherein a material of the thermal insulating area comprises styrofoam, cotton, wood, or plant fiber.

11. The electronic device according to claim 9, wherein a thermal conducting speed of the thermal conducting area in a first direction is greater than a thermal conducting speed of the thermal conducting area in a second direction, the second direction is a normal vector of a plane of the core layer and the first direction is vertical to the second direction.

12. The electronic device according to claim 9, wherein a material of the thermal conducting area comprises graphite.

13. The electronic device according to claim 9, wherein the shell structure further comprises:
   a first bonding layer, located between the core layer and the first material layer, and used to bond the core layer and the first material layer; and
   a second bonding layer, located between the core layer and the second material layer, and used to bond the core layer and the second material layer.

14. The electronic device according to claim 13, wherein the first bonding layer located between the thermal conducting area and the first material layer and the second bonding layer located between the thermal conducting area and the second material layer are bonding layers with high thermal conducting coefficients.

15. The electronic device according to claim 9, wherein the heat generating element contacts the second material layer.

16. The electronic device according to claim 9, wherein the core layer is a woven layer and the first material layer and the second material layer are metal plates.

\* \* \* \* \*